(12) United States Patent
Willwohl et al.

(10) Patent No.: US 9,263,651 B2
(45) Date of Patent: Feb. 16, 2016

(54) COLLIMATOR

(75) Inventors: Harald Willwohl, Aachen (DE); Josef Andreas Schug, Wuerselen (DE); Wouter Petrus Kaandorp, Best (NL); Mathijs De Wit, Brasil de Mora (CR); Norbertus Antonius Maria Sweegers, Lierop (NL); Gerardus Henricus Franciscus Willebrordus Steenbruggen, Wamel (NL); Ralph Hubert Peters, Maastricht (NL)

(73) Assignee: Koninklijke Philips N.V., Eindhoven (NL)

( * ) Notice: Subject to any disclaimer, the term of this patent is extended or adjusted under 35 U.S.C. 154(b) by 396 days.

(21) Appl. No.: 12/678,322

(22) PCT Filed: Sep. 16, 2008

(86) PCT No.: PCT/IB2008/053742
§ 371 (c)(1),
(2), (4) Date: Dec. 3, 2010

(87) PCT Pub. No.: WO2009/037632
PCT Pub. Date: Mar. 26, 2009

(65) Prior Publication Data
US 2011/0075429 A1    Mar. 31, 2011

(30) Foreign Application Priority Data

Sep. 20, 2007  (EP) ..................................... 07116838

(51) Int. Cl.
*H01L 33/60*  (2010.01)
*H01L 33/58*  (2010.01)
(Continued)

(52) U.S. Cl.
CPC ................ *H01L 33/60* (2013.01); *H01L 33/58* (2013.01); *F21K 9/00* (2013.01); *H01L 25/0753* (2013.01)

(58) Field of Classification Search
CPC ..... F21Y 2101/02; F21V 5/04; F21V 29/004; F21L 15/02; F21K 9/00; F21S 4/003; G02F 1/133611; G02F 1/133605; G02F 1/33603
USPC ............... 362/311.12, 800, 249.02, 235, 613, 362/97.3
See application file for complete search history.

(56) References Cited

U.S. PATENT DOCUMENTS 5,156,144 A * 10/1992 Iwasaki et al. ..................... 601/4
6,593,598 B2 * 7/2003 Ishinaga .......................... 257/98
(Continued)

FOREIGN PATENT DOCUMENTS

DE    202004011015 U1    12/2004
DE    102004036157 A1    2/2006
(Continued)

*Primary Examiner* — Jong-Suk (James) Lee
*Assistant Examiner* — Mark Tsidulko

(57) ABSTRACT

An LED package including a collimator body adapted to collect and/or reflect and/or focus light. An upper plane provided by the collimator body defines a mainly horizontal plane. At least one reflection surface is provided by the collimator body and is at least partially angled to the horizontal plane. The collimator body includes a recess for receiving a lighting element including a light emitting front face such that the reflection surface extends at least partially below the level of the front face in an assembled state. Due to the angle of the reflection surface with respect to the horizontal plane of the collimator body, a small light source and a high luminous flux at the same time are provided so that the luminance and the brightness of the LED package are increased.

9 Claims, 2 Drawing Sheets

(51) Int. Cl.
*F21K 99/00* (2010.01)
*H01L 25/075* (2006.01)

(56) References Cited

U.S. PATENT DOCUMENTS

| | | | |
|---|---|---|---|
| 7,411,222 B2 * | 8/2008 | Kinoshita et al. | 257/98 |
| 7,717,589 B2 * | 5/2010 | Nishioka et al. | 362/293 |
| 7,918,583 B2 * | 4/2011 | Chakmakjian et al. | 362/240 |
| 2002/0085390 A1 | 7/2002 | Kiyomoto et al. | |
| 2003/0201451 A1 * | 10/2003 | Suehiro et al. | 257/98 |
| 2004/0041222 A1 | 3/2004 | Loh | |
| 2004/0160772 A1 | 8/2004 | Tatsukawa et al. | |
| 2005/0127485 A1 | 6/2005 | Shei et al. | |
| 2005/0135105 A1 | 6/2005 | Teixeira et al. | |
| 2006/0157722 A1 | 7/2006 | Takezawa et al. | |
| 2006/0226437 A1 | 10/2006 | Fujita et al. | |
| 2007/0085103 A1 | 4/2007 | Nishioka et al. | |
| 2007/0158674 A1 | 7/2007 | Taguchi et al. | |
| 2008/0231170 A1 * | 9/2008 | Masato et al. | 313/501 |
| 2009/0001490 A1 | 1/2009 | Bogner et al. | |

FOREIGN PATENT DOCUMENTS

| | | |
|---|---|---|
| DE | 102005031336 A1 | 11/2006 |
| EP | 1710846 A1 | 10/2006 |
| JP | 2006294804 A | 10/2006 |
| JP | 2007157561 A | 6/2007 |
| WO | 2004070839 A2 | 8/2004 |
| WO | 2006012842 A2 | 2/2006 |
| WO | 2006033032 A1 | 3/2006 |
| WO | 2006033032 A2 | 3/2006 |
| WO | 2006064434 A2 | 6/2006 |
| WO | 2006099741 A1 | 9/2006 |

\* cited by examiner

COLLIMATOR

FIELD OF THE INVENTION

The invention relates to the field of collimators for use as part of a LED package in order to collect and/or focus light emitted by at least one light emitting diode (LED) of the LED package.

BACKGROUND OF THE INVENTION

From US 2004/0041222 A1 a LED package is known, which comprises a collimator for collecting light emitted by a lighting element illuminated by a LED. The collimator surrounds the lighting element so that the collimator is able to collect light emitted via side faces of the lighting element. The collimator comprises reflection surfaces angled by 45° to a horizontal plane of the LED package so that the light emitted via the side faces is reflected by the reflection surfaces from a horizontal direction into a vertical direction.

It is a disadvantage of such kind of a collimator that the brightness of the LED package comprising such kind of a collimator is low in comparison to the collectable luminous flux.

SUMMARY OF THE INVENTION

It is an object of the invention to provide a collimator providing an increased brightness for a LED package. Particularly it is an object of the invention to provide a collimator providing an increased luminance for a LED package.

This object is achieved by a collimator for use as part of a LED package, comprising a collimator body adapted to collect and/or reflect and/or focus light, an upper plane provided by the collimator body, wherein the upper plane defines a mainly horizontal plane, at least one reflection surface provided by the collimator body, wherein the reflection surface is at least partially angled to the horizontal plane by an angle $\alpha$, which is $70° \leq \alpha \leq 110°$, particularly $75° \leq \alpha \leq 100°$, preferably $78° \leq \alpha \leq 92°$, most preferred $79° \leq \alpha \leq 85°$, wherein the collimator body comprises a recess for receiving a lighting element comprising a light emitting front face illuminated by a LED, wherein the lighting element is received such by the recess that the reflection surface extends at least partially below the level of the front face in assembled state.

Since the at least one reflection surface extends below the level of the front face of the lighting element the collimator according to the invention is capable to collect light emitted by side faces of the lighting element. This leads to a very high collectable luminous flux. Due to the specific angle $\alpha$ of the reflection surface with respect to the horizontal plane of the collimator body the reflection surface is arranged sharper leading to a smaller light source area, through which the collected luminous flux leaves the collimator. Thus, a small light source and a high luminous flux at the same time are provided so that the luminance and the brightness of the LED package are increased. The area providing the light source area may be provided by an opening in the collimator body, wherein the reflection surfaces are arrange at an inner part of the collimator, or by a mainly transparent collimator body itself, wherein the reflection surfaces are arranged at outside faces of the collimator body. It is even possible that the light source area through which the collected luminous flux leaves the collimator is smaller than (the sum of) the light emitting front face(s) of the lighting element(s), for instance when the angle $\alpha$, is $90° \leq \alpha \leq 110°$, particularly $95° \leq \alpha \leq 100°$ so that the luminance is further increased. In order to reduce the amount of reflections of the collected light it could be advantageous when the angle $\alpha$ is $70° \leq \alpha \leq 90°$, particularly $75° \leq \alpha \leq 80°$. Depending on the design of the LED package and the design of the lighting element(s) a person skilled in the art is able to optimize the angle $\alpha$ with respect to a maximized luminance by testing.

Preferably the reflection surface is provided by the recess and the recess comprises an emitting opening arranged in the upper plane of the collimator body. The light source area and the recess for receiving the lighting element(s) may be provided by the same opening facilitating the manufacture. Further the weight of the collimator is reduced and the emitting opening may be used to receive and/or connect further elements like a lens or the like.

Particularly a ratio r of the light source area, through which light passes the horizontal plane, to the area of the emitting front face or, if so, the sum of areas of the emitting front faces of a plurality of lighting elements in assembled state is $0.95 \leq r \leq 1.50$, particularly $1.10 \leq r \leq 1.45$, preferably $1.20 \leq r \leq 1.40$ and most preferred $1.30 \leq r \leq 1.35$. This ratio leads to a small light source area, for instance a small emitting opening of the collimator body, which comprises a high luminance and a high luminous flux. Due to the concentration of the collected luminous flux the emitted light may be easily guided by additional lens systems. Particularly, when a LED package comprising the collimator according to the invention is uses for a motor vehicle headlight, the emitted light may be easily directed such that a blinding of a meeting car driver is prevented.

In a preferred embodiment the at least one reflection surface of the collimator may be arranged very close to the lighting element(s) in assembled state. This leads to a small light source area and a high luminance. For that reason only a small gap may be provided between the recess of the collimator and the lighting element. Particularly between an inside surface of the recess and the lighting element a gap is provided in assembled state, wherein the gap is 5 µm-100 µm, particularly 10 µm-70 µm, preferably 15 µm-50 µm and most preferred 20 µm-30 µm. This dimension of the gap allows a small light source area and a clearance fit for a facilitated assembling of the collimator to the LED package without disturbing the lighting element.

Preferably the reflection surface comprises a first area arranged at a lower height and a second area arranged at a higher height, wherein the angle $\alpha$ of the first area is different to the angle $\alpha$ of the second area, whereby particularly the angle $\alpha$ of the first area is lower than the angle $\alpha$ of the second area. FIG. 4 illustrates an example 35 of the first area and an example 37 the second area. Further, as illustrated in FIG. 4, the first area 35 includes a first portion 50 that is at a height at which the second area 37 is disposed and includes a second portion 51 that extends below the second area 37. As also illustrated in FIG. 4, the first and second portions share a common angle $\alpha$. This design allows providing a small light source area and collecting light emitted by the side faces of the lighting element at the same time, wherein this light is not subjected to many reflections inside the collimator.

Further the reflection surface may be at least partially curved, particularly concave. This leads for instance to smooth borders between illuminated and not illuminated areas.

The invention further relates to a LED package for use in a lamp, comprising a substrate comprising an upper surface, at least one lighting element for emitting light via an emitting surface pointing away from the upper surface, wherein the lighting element comprises a LED connected to the substrate, and a collimator, which may be designed as previously described, for guiding the emitted light. This LED package comprises a small light source area and a high luminous flux at the same time so that the luminance and the brightness of the LED package are increased.

Preferably a plurality of lighting elements arranged in a regular pattern, particularly in a line and/or in columns and lines, are provided, wherein the pattern of lighting elements are received by the recess of the collimator. This regular array of lighting elements can be easily manufactured for example by automatically arranging the lighting element onto the substrate. Moreover a single collimator is sufficient to receive the plurality of lighting elements. Particularly adjacent lighting elements comprise a distance to each other of 5 µm-100 µm, particularly 10 µm-70 µm, preferably 15 µm-50 µm and most preferred 20 µm-30 µm. Due to this distance a gap is provided providing electrical insulation of the lighting element to each other, wherein the gap is small enough that significant changes of the light intensity of the light emitted via the collimator are avoided.

It is not necessary that the lighting element consists of a single LED. It is preferred that the lighting element comprises at least one LED connected to the substrate and a phosphor covering the LED, wherein the phosphor comprises the light emitting front face and light emitting side faces connected to the front face. Particularly the LED provides mainly blue light, wherein the phosphor provides mainly yellow light so that in sum mainly white light is provided by the lighting element.

In a preferred embodiment the LED package comprises a cover, particularly of a plastic material, for covering the lighting element and the substrate, wherein the collimator is provided by the cover or the collimator is received by and connected to the cover. Thus, it is possible to assemble the collimator together with the cover to the LED package. The assembling of the LED package is facilitated and a poor optical performance due to tolerances is avoided since a tolerance between the collimator and the cover is not provided or a tolerance between the collimator and the cover may be automatically adapted to the tolerances between the collimator and the lighting element during assembling. For example the collimator may be press fitted by an aperture of the cover.

Preferably the cover comprises at least one, particularly three, reference elements for precise positioning the LED package relative to a housing and/or relative to an optical system. Since manufacturing tolerances between the collimator and the cover are avoided or mainly compensated, it is sufficient to provide the cover with to reference elements particularly instead of the collimator. Although the collimator may not comprise reference elements a precise positioning of the collimator with respect to an optical system or the like is provided via the cover. Preferably the reference elements are shaped as protrusions, by which a definite plane may be provided. In assembled state a precise position and alignment of the collimator is provided by means of the reference elements, so that a precise mechanical as well as a precise optical alignment at the same time by means of the same elements may be provided.

The invention further relates to a lamp, particularly headlight or taillight for motor vehicles, comprising a LED package, which may be designed as previously described, connected to a housing, wherein the housing comprises at least one lens arranged adjacent to the collimator. Due to the lens, which may be part of a lens system, the light emitted from the LED package may be focused as desired. Since the LED package is connected to the housing, an exact positioning of the LED package with respect to housing is possible so that the lens may be arranged very accurate with respect to light source area of the collimaltor of the LED package. Preferably the lens is arranged close to the light source area so that mainly all emitted light is collected by the lens.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
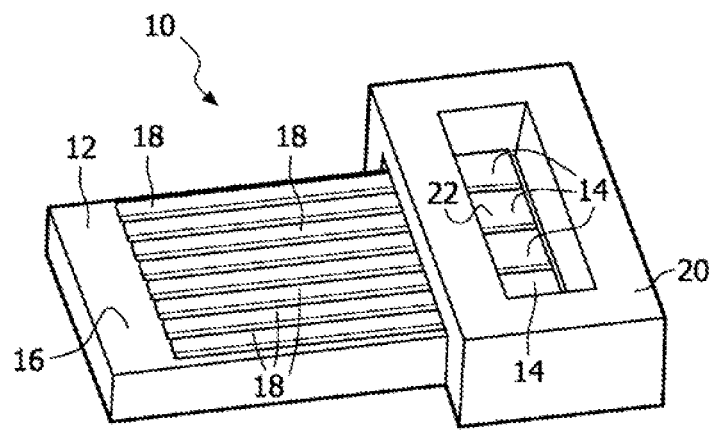
FIG. 1 is a schematic perspective view of a LED package comprising the collimator according to the invention.
Figure 2:
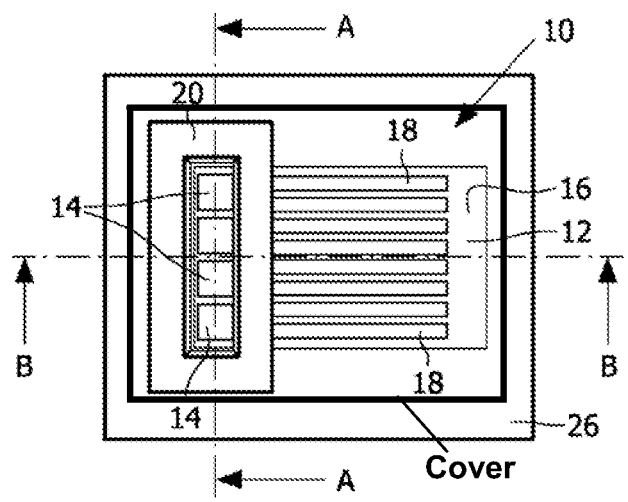
FIG. 2 is a schematic top view of the LED package of FIG. 1.

The LED package 10 illustrated in FIG. 1 comprises a substrate 12 to which four lighting elements 14 arranged in a line are connected. On an upper surface 16 of the substrate 12 connector lines 18 are provided, which are connected to the lighting elements 14. Via the connector lines 18 an electric source may be applied to the lighting elements 14. Further a collimator 20 is provided to collect and guide light emitted by the lighting elements 14 via a light emitting front face 22 and side faces 24. The LED package may be connected to a heat sink, for example a copper plate 26, by which the heat generated in the lighting elements 14 is led away due to its high heat conductivity (FIG. 2).

Figure 3:
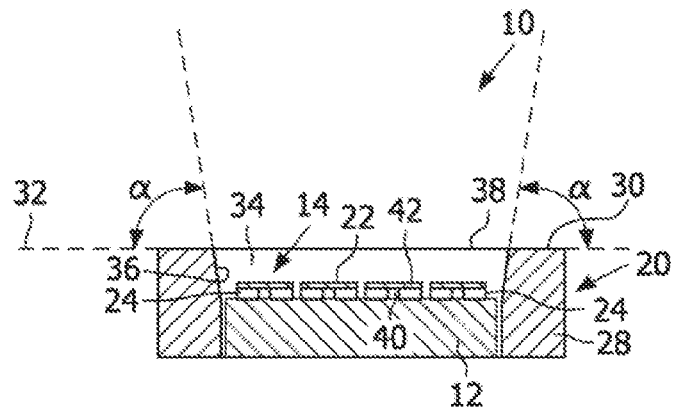
FIG. 3 is a schematic sectional view of the LED package along line A-A of FIG. 2
Figure 4:
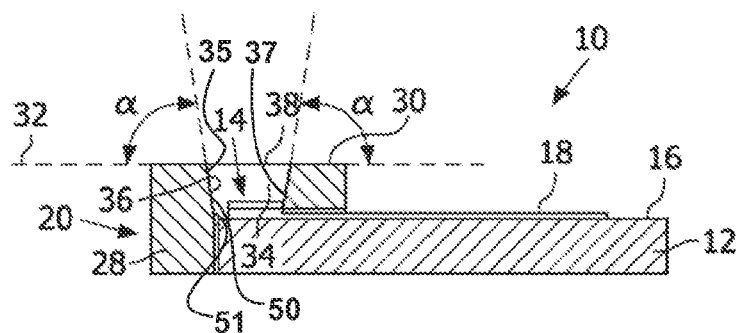
FIG. 4 is a schematic sectional view of the LED package along line B-B of FIG. 2

As illustrated in FIG. 3 and FIG. 4 the collimator 20 comprises a collimator body 28 comprising an upper plane 30, by which a horizontal plane 32 is defined. The collimator body 28 comprises a recess 34, wherein a reflection surface 36 is provided by an inside face of the recess 34. Between the horizontal plane 32 and the reflection surface 36 an angle α is provided, which is ca. 82°, this means significant greater than 45°. The recess 34 provides an emitting opening 38 in the horizontal plane 32, wherein a light source area is provided by the emitting opening 38.

The lighting element 14 comprises a LED 40 connected to the substrate 12. The LED 40 is covered by a phosphor 42, which is illuminated by the LED 40. The light emitting front face 22 and mainly the side faces 24 are provided by the phosphor 42.

Figure 5:
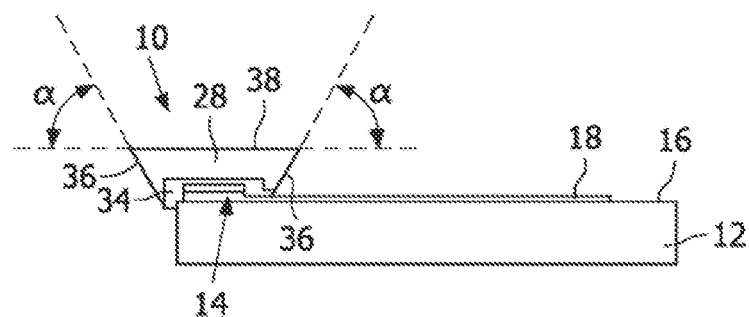
FIG. 5 is a schematic sectional view of a LED package in a second embodiment.

As illustrated in FIG. 5 in a further embodiment of the invention the collimator body 28 of the collimator 20 may be mainly transparent. In this case the reflection surface 36 is provided by an outside face of the collimator body 28. Further the light source area is defined by the upper plane 30 of the collimator body 28.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the angle α is greater than 90° and the light source area smaller than the sum of the light emitting front faces 22 of the lighting element 14.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An LED package for use in a lamp, comprising:
   a substrate comprising an upper surface;
   at least one lighting element having a front face for emitting light via an emitting surface pointing away from the upper surface; and
   a collimator for guiding the emitted light, the collimator comprising:
     a substantially horizontal upper plane,
     a recess for receiving the front face of the at least one lighting element,
     a reflection surface disposed in the recess, wherein the reflection surface extends at least partially below the front face when the at least one lighting element is received in the recess, and
     a light source area through which the emitted light passes the horizontal upper plane,
   wherein a ratio of the light source area to the area of the front face is greater than or equal 0.95 and less than or equal 1.50, wherein the reflection surface comprises a first area, wherein the first area includes a first portion that is at a height at which the second area is disposed and a second portion that extends below said second area, wherein the first and second portions of the first area are disposed in the recess at a common angle relative to the horizontal upper plane that is different than an angle relative to the horizontal upper plane of the second area, and wherein each of said angles relative to the horizontal upper plane is greater than or equal to 70° and less than or equal to 110°.

2. A collimator configured to perform at least one of collection, reflection or focusing of light of a LED package, the collimator comprising:
   a collimator body including a recess for receiving at least one lighting element, a substantially horizontal upper plane, and a reflection surface disposed in the recess, wherein the reflection surface extends at least partially below a front face of the at least one lighting element when the at least one lighting element is received in the recess, wherein a ratio of a light source area through which light passes the horizontal plane to the area of the front face of the at least one lighting element is greater than or equal 0.95 and less than or equal 1.50, wherein the reflection surface comprises a first area and a second area, wherein the first area includes a first portion that is at a height at which the second area is disposed and a second portion that extends below said second area, wherein the first and second portions of the first area are disposed in the recess at a common angle relative to the horizontal plane that is different than an angle relative to the horizontal plane of the second area, and wherein each of said angles relative to the horizontal plane is greater than or equal to 70° and less than or equal to 110°.

3. The collimator according to claim 2, wherein the ratio is greater than or equal 1.30 and less than or equal 1.35.

4. The collimator according to claim 2, comprising a gap between the inside surface of the recess and the at least one lighting element, wherein the gap has a width of 5 µm-100 µm.

5. The collimator according to claim 2, wherein the angle relative to the horizontal plane of the first area is less than the angle relative to the horizontal plane of the second area.

6. The collimator according to claim 2, wherein the reflection surface is at least partially curved.

7. The LED package according to claim 1, wherein the at least one light source comprises at least one LED and a phosphor layer at least partially covering the LED, wherein the phosphor layer comprises the front face and side faces connected to the front face.

8. The LED package according to claim 7, further comprising a cover, for covering the at least one lighting element, wherein the collimator is received by and connected to the cover.

9. The collimator according to claim 2, wherein the reflection surface is a part of the recess and the recess comprises an inside surface and an emitting opening arranged in the horizontal plane.

* * * * *